(12) United States Patent
Peake

(10) Patent No.: US 9,985,092 B2
(45) Date of Patent: May 29, 2018

(54) POWERMOS

(71) Applicant: Nexperia B.V., AB Nijmegen OT (NL)

(72) Inventor: Steven Thomas Peake, Warrington (GB)

(73) Assignee: Nexperia B.V., Nijmegen (NL)

( * ) Notice: Subject to any disclaimer, the term of this patent is extended or adjusted under 35 U.S.C. 154(b) by 0 days. days.

(21) Appl. No.: 15/263,675

(22) Filed: Sep. 13, 2016

(65) Prior Publication Data
US 2018/0076279 A1 Mar. 15, 2018

(51) Int. Cl.
| H01L 29/00 | (2006.01) |
| H01L 29/06 | (2006.01) |
| H01L 29/78 | (2006.01) |
| H01L 29/66 | (2006.01) |
| H01L 29/40 | (2006.01) |
| H01L 29/10 | (2006.01) |

(52) U.S. Cl.
CPC ........ H01L 29/063 (2013.01); H01L 29/0696 (2013.01); H01L 29/1095 (2013.01); H01L 29/401 (2013.01); H01L 29/407 (2013.01); H01L 29/408 (2013.01); H01L 29/66734 (2013.01); H01L 29/7813 (2013.01)

(58) Field of Classification Search
CPC .................................................. H01L 29/0696
See application file for complete search history.

(56) References Cited

U.S. PATENT DOCUMENTS

2008/0064166 A1* 3/2008 Peake ................. H01L 29/0634
  438/270
2011/0121384 A1* 5/2011 Peake ................. H01L 29/1095
  257/330

* cited by examiner

*Primary Examiner* — William Harriston
(74) *Attorney, Agent, or Firm* — Ohlandt, Greeley, Ruggiero & Perle, L.L.P.

(57) ABSTRACT

A process of manufacturing a device is disclosed. The process includes forming an epitaxial layer of a first conductivity type on in a substrate, forming a first vertical section of a second conductivity type in the expitaxial layer, creating a first vertical trench through etching vertically next to the first vertical section, filling the first vertical trench with a first type oxide, forming a second vertical trench in the first vertical trench. The second vertical trench is bounded by the first type oxide in the first vertical trench. The process further includes forming a second type oxide on inner walls of the second vertical trench, filling the second vertical trench with polysilicon. In a second vertical section of the epitaxial layer vertically next to the first vertical trench, a body region is created by implanting ions of the first conductivity type and a source region is created by implanting ions in a top layer of the body region.

13 Claims, 3 Drawing Sheets

POWERMOS

BACKGROUND

Trench gate technology is commonly used for improved break down voltage characteristics in semiconductor devices, especially high voltage devices. In the trench gate technology, the gate is vertically buried in the source, typically separated by an isolation cover. Other advantages of the trench gate technology include reduced junction gate field effect transistor (JFET) effect that may be undesirable at least in some applications. However, the trench gate technology does offer some disadvantages when lower voltage configurations are desired due to a need to reduce the width of the embedded gate. Reduced Surface Field (RESURF) technology is one of the most widely-used methods for the design of lateral high-voltage, low on-resistance devices. The technique has allowed the integration of high voltage devices, ranging from 20 V to 1200 V, with bipolar and MOS transistors.

TrenchMOS (Metal Oxide Semiconductor with trench gate) semiconductor devices are commonly used for power applications. A TrenchMOS device typically includes a semiconductor substrate having a layer of epitaxially grown, doped silicon located thereon, in which is formed a trench containing a gate electrode and gate dielectric. A source region of the device is located adjacent an upper part of the trench. The device also includes a drain region, which is separated from the source region by a body region, through which the trench extends.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment process of manufacturing a device is disclosed. The process includes forming an epitaxial layer of a first conductivity type on in a substrate, forming a first vertical section of a second conductivity type in the epitaxial layer, creating a first vertical trench through etching vertically next to the first vertical section, filling the first vertical trench with a first type oxide, forming a second vertical trench in the first vertical trench. The second vertical trench is bounded by the first type oxide in the first vertical trench. The process further includes forming a second type oxide on inner walls of the second vertical trench, filling the second vertical trench with polysilicon. In a second vertical section of the epitaxial layer vertically next to the first vertical trench, a body region is created by implanting ions of the first conductivity type and a source region is created by implanting ions in a top layer of the body region.

In some embodiments, the process of manufacturing of the device further includes forming a layer of the first type oxide over the first vertical section, the first vertical trench and the second vertical section. The first type oxide is tetraethylorthosilicate (TEOS dielectric). The second type oxide is silicon dioxide. The first conductivity type is n-type. The second conductivity type is p-type.

In another embodiment, a device is disclosed. The device includes a substrate having an epitaxial layer of a first conductivity type. The device further includes two symmetrical and identical cells embodied in the epitaxial layer, wherein each of the two symmetrical cells including a deep trench, a Reduced Surface Field (RESURF) plate of a second conductivity type, a gate electrode embodied in the deep trench, a body region, a source region, and a drain region. The two symmetrical and identical cells are combined such that the combination shares the drain region and the RESURF plate.

In some embodiments, the deep trench is filled with an oxide and the body region is of the second conductivity type. The gate electrode in embodied in the deep trench and the gate electrode is filled with polysilicon and bound by a gate oxide. The source region is formed over the body region such that the source region fully covers the body region and each of the two symmetrical and identical cells includes a dielectric layer that substantially covers the gate electrode and the source region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Intermediate steps between figure transitions have been omitted so as not to obfuscate the disclosure. Those intermediate steps are known to a person skilled in the art.

DETAILED DESCRIPTION

Many well-known fabrication steps, components, and connectors have been omitted or not described in details in the description so as not to obfuscate the present disclosure.

Figure 1:
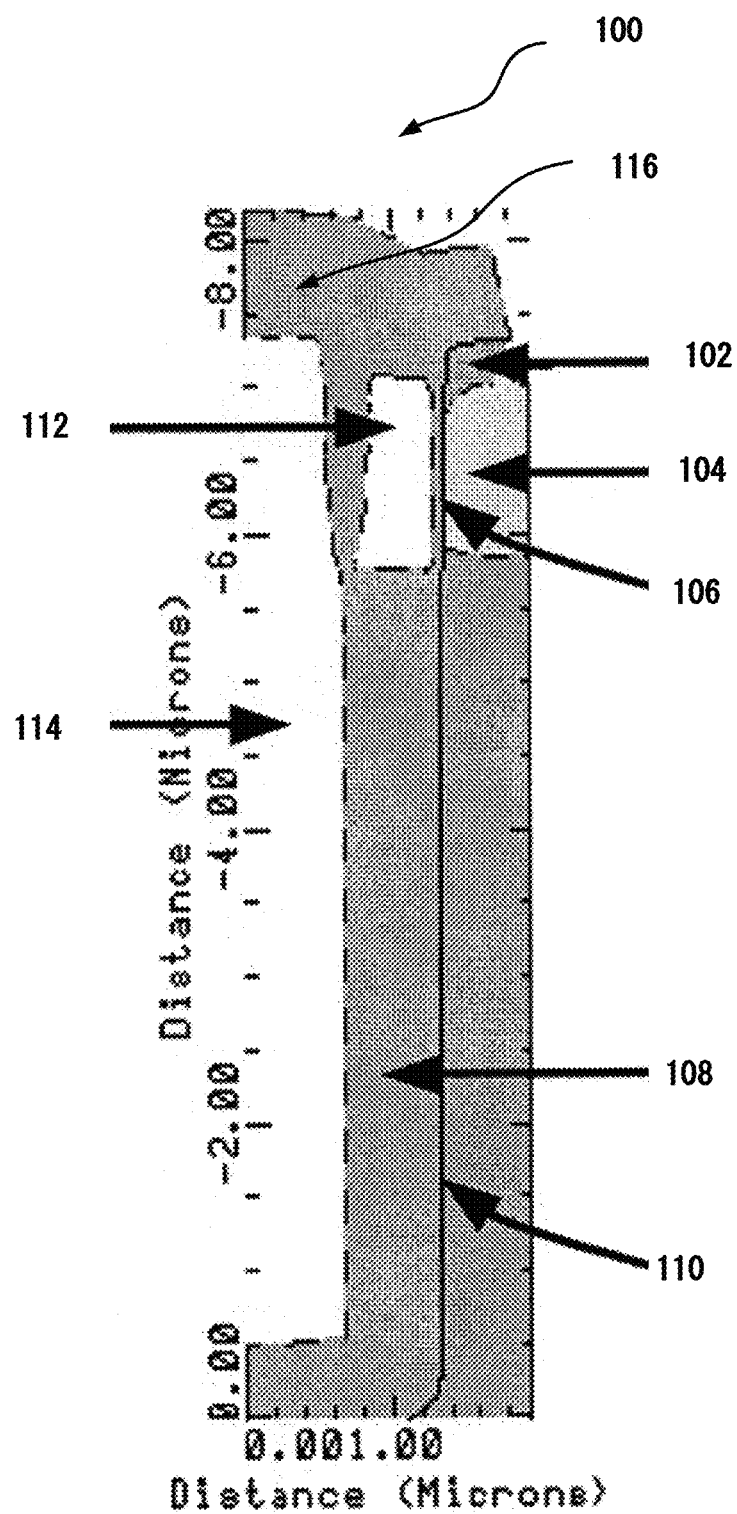
FIG. 1 depicts a schematic of a cross sectional view of a device showing the gate in a trench, a body region and a RESURF plate in accordance with one or more embodiments of the present disclosure.

FIG. 1 depicts a schematic of a cross sectional view of a device 100 fabricated using process described later in this document. The device 100 include a gate electrode 112, a RESURF plate 114, a source region 102, a body region 104, a gate dielectric 106 and a trench 110 that is filled with a dielectric 108.

One method of fabricating such devices is to fabricate the gate electrode in a shallow trench and then create a RESURF plate by implanting p-type RESURF region at a high energy so that the RESURF plate goes deeper (to achieve high breakdown voltage ($BV_{dss}$)). However, as the energy increases, the implanted species penetrates the implant mask that is put in place to protect areas other than the area through which the RESURF plate is being created. This penetration and lateral straggle of implants cause higher $R_{dson}$ that is undesirable.

The device 100 may also fabricated using four terminal RESURF technology. However, the process is complex and requires special fab changes. Also, new optimization of device design may be required for different $BV_{dss}$ specifications.

Figure 2:
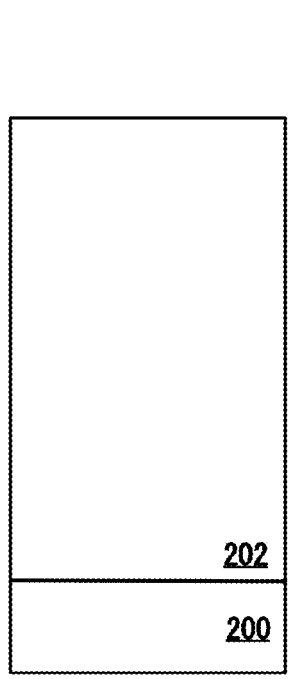
FIGS. 2-10 depict a schematic of a section of the device in various incremental stages of fabrication in accordance with one or more embodiments of the present disclosure.

The fabrication of the device 100 according to embodiments described herein starts at a substrate 200 as shown in FIG. 2. Note that only a section of the substrate 200 is being shown. An expitaxial layer 202 is implanted on the top layer of the substrate 200. The expitaxial layer 202 is n-type and may be formed using phosphorous. Other materials may be used to form this expitaxial layer 202 so long the material is capable of providing an n-type implant.

Figure 3:
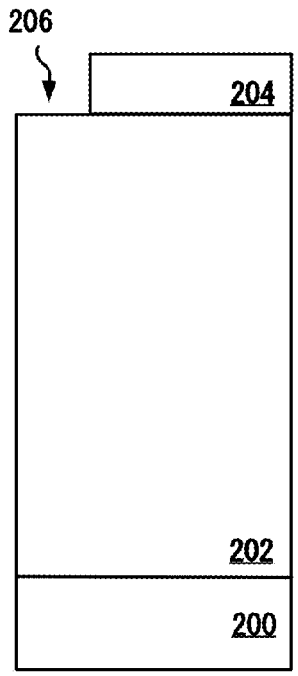

As depicted in FIG. 3, a photoresist layer 204 is formed on the surface of the expitaxial layer 202. A part 206 of the photoresist layer 206 is etched using well known etching methods. The width of the part 206 is roughly equal to a desired width of the RESURF plate 114. The REFURF plate 114 may be implanted or may also be formed using the process of ion deposition. It should be noted that the process described here is for the fabrication of a NMOS device. A person skilled in the art would realize that the process described herein may also be used for the fabrication of a PMOS device.

Figure 4:
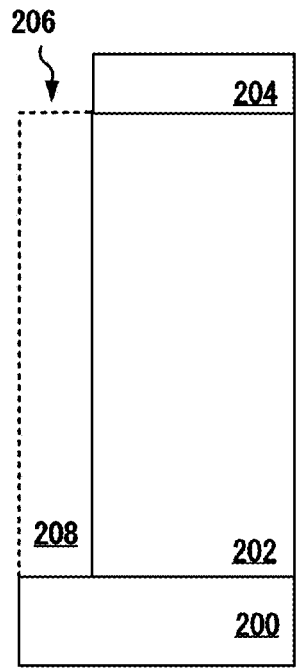
Figure 5:
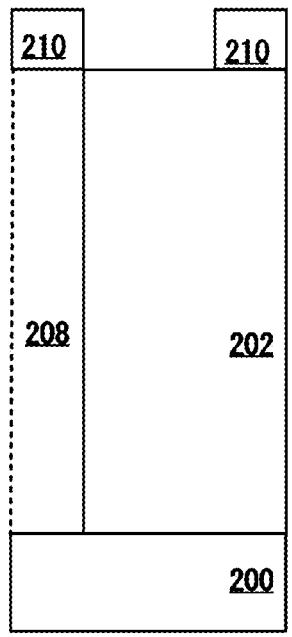
Figure 6:
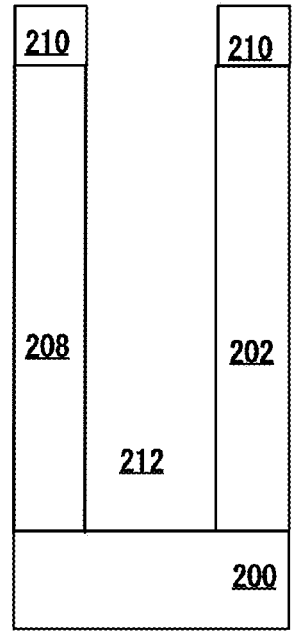
Figure 7:
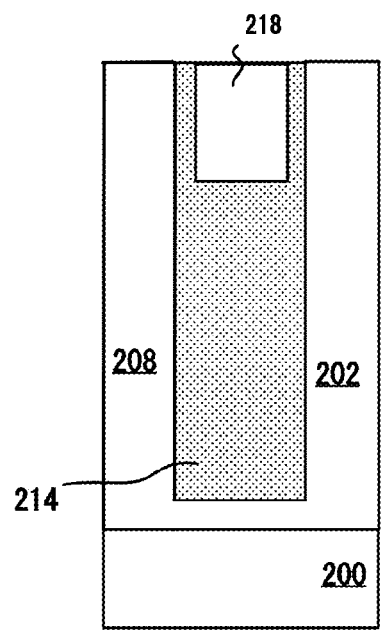

FIG. 4 shows implantation of p-type epitaxial 208 through the part 206. Boron or similar material may be used for such implantation. The photoresist layer 204 is then removed and as shown in FIG. 5, a second photoresist layer 210 is formed on the surface. The second photoresist layer 210 is etched in the middle. As shown in FIG. 6, the etching goes on to create a trench 212. As shown in FIG. 7, the trench 212 is then filled with tetraethylorthosilicate (TEOS dielectric) 214 or a similar material. A part of the trench 212 is etched similar to the process shown in FIG. 6 and gate oxide (e.g., silicon dioxide) is formed on the walls and bottom of the etched space. The etched space is then filled with n-type polysilicon to form the gate electrode 218.

Figure 8:
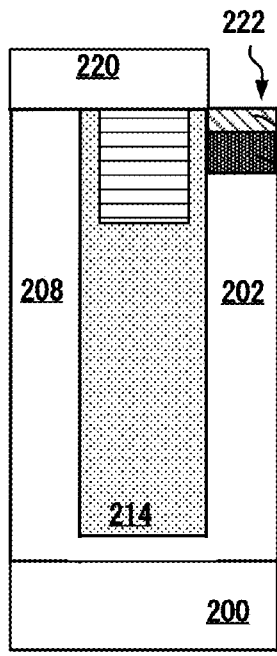

As shown in FIG. 8, a photoresist layer 220 is formed and a space 222 is etched away. Through the space 222, first p-type body region 104 is implanted, preferably using Boron. On top of the p-type body region 104, n-type source region 102, using arsenic or similar material, is implanted.

Figure 9:
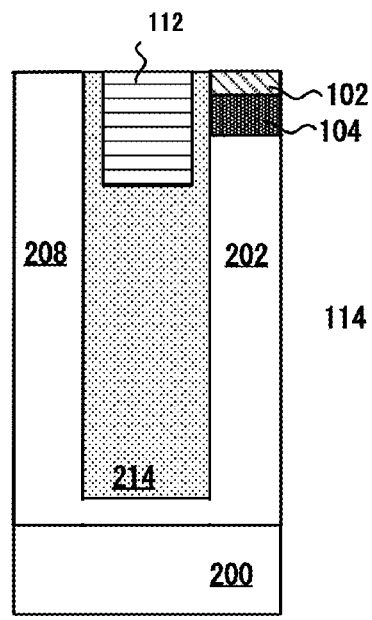
Figure 10:
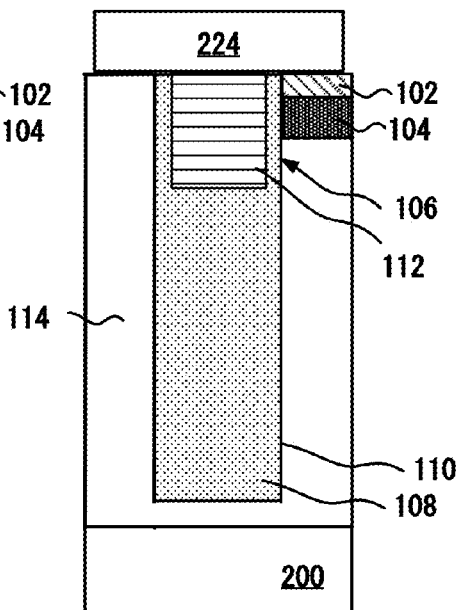

As shown in FIG. 9, the photoresist layer 220 is removed and as shown in FIG. 10, a TEOS Dielectric layer 224 is deposited over the RESURF plate 114, the gate electrode 112 and the source region 102.

The process described above uses standard fabrication technologies without requiring any specialized process control or fab modifications. The process is also suitable for fabricating devices with various $BV_{dss}$ without any fabrication step changes. A higher $BV_{dss}$ may be obtained compared to prior art fabrication technologies because in this process it is easier to control the size of the RESURF plate 114 and the size of the gate electrode 112.

Figure 11:
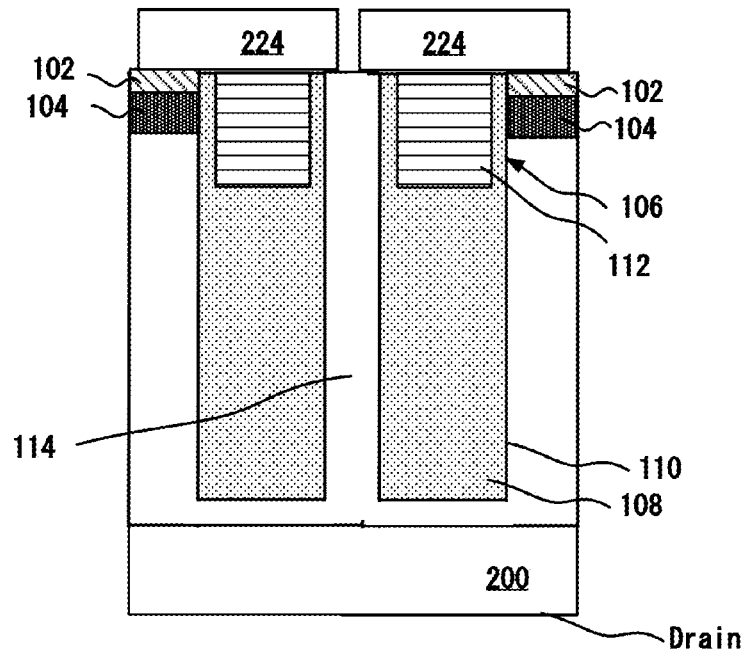
FIG. 11 depicts a full transistor including two half cells described in FIGS. 1-10 in accordance with one or more embodiments of the present disclosure.

Above figures describes the fabrication of half cells. FIG. 11 depicts a combination of such two half cells to make a transistor. The two half cells fabricated symmetrically side by side in mirrored fashion so that the two half cells share the RESURF plate 114. The device can be distinguished from other devices manufactured using other techniques by the fact that there is only one channel per half cell. The region bounded by the deep trenches 108 is not contributing to $R_{dson}$ but is biased at source to give a 0V RESURF shield.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:
1. A process of manufacturing a device, the process comprising:
   forming an epitaxial layer of a first conductivity type on in a substrate;
   forming a first vertical section of a second conductivity type in the expitaxial layer;
   creating a first vertical trench through etching vertically next to the first vertical section;
   filling the first vertical trench with a first type oxide;

forming a second vertical trench in the first vertical trench, wherein the second vertical trench is bounded by the first type oxide in the first vertical trench;

forming a second type oxide on inner walls of the second vertical trench;

filling the second vertical trench with polysilicon;

in a second vertical section of the epitaxial layer vertically next to the first vertical trench, implanting ions of the first conductivity type to create a body region; and in the second vertical section, implanting ions to create a source region in a top layer of the body region.

2. The process of manufacturing of claim 1, further including forming a layer of the first type oxide over the first vertical section, the first vertical trench and the second vertical section.

3. The process of manufacturing of claim 1, wherein the first type oxide is tetraethylorthosilicate (TEOS dielectric).

4. The process of manufacturing of claim 1, wherein the second type oxide is silicon dioxide.

5. The process of manufacturing of claim 1, wherein the first conductivity type is n-type.

6. The process of manufacturing of claim 1, wherein the second conductivity type is p-type.

7. The device of claim 1, wherein the source region is formed over the body region such that the source region fully covers the body region.

8. The device of claim 1, wherein each of the two symmetrical and identical cells includes a dielectric layer that substantially covers the gate electrode and the source region.

9. A device, comprising:

a substrate having an epitaxial layer of a first conductivity type;

two symmetrical and identical cells embodied in the epitaxial layer, wherein each of the two symmetrical cells includes a deep trench, a Reduced Surface Field (RESURF) plate of a second conductivity type, a gate electrode embodied in the deep trench, a body region, a source region, and a drain region; and wherein the two symmetrical cells are combined such that the combination shares the drain region and the RESURF plate, and the RESURF plate is between vertical sidewalls from each deep trench of the two symmetrical cells.

10. The device of claim 9, wherein the deep trench is filled with an oxide.

11. The device of claim 9, wherein the body region is of the second conductivity type.

12. The device of claim 9, wherein the gate electrode in embodied in the deep trench.

13. The device of claim 12, wherein the gate electrode is filled with polysilicon and bound by a gate oxide.

* * * * *